(12) United States Patent
Fantini et al.

(10) Patent No.: US 11,005,038 B2
(45) Date of Patent: May 11, 2021

(54) MEMORY DEVICES AND ELECTRONIC DEVICES INCLUDING MEMORY MATERIALS SUBSTANTIALLY ENCAPSULATED WITH DIELECTRIC MATERIALS

(71) Applicant: Micron Technology, Inc., Boise, ID (US)

(72) Inventors: Paolo Fantini, Vimercate (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/783,774

(22) Filed: Feb. 6, 2020

(65) Prior Publication Data
US 2020/0176675 A1    Jun. 4, 2020

Related U.S. Application Data

(63) Continuation of application No. 16/185,829, filed on Nov. 9, 2018, now Pat. No. 10,600,960, which is a
(Continued)

(51) Int. Cl.
*H01L 45/00* (2006.01)
*H01L 27/00* (2006.01)
*H01L 27/24* (2006.01)

(52) U.S. Cl.
CPC ............ *H01L 45/141* (2013.01); *H01L 45/06* (2013.01); *H01L 45/12* (2013.01);
(Continued)

(58) Field of Classification Search
CPC . H01L 45/06; H01L 45/1233; H01L 45/1675; H01L 45/1608; H01L 45/12;
(Continued)

(56) References Cited

U.S. PATENT DOCUMENTS

| | | | |
|---|---|---|---|
| 5,355,330 A | * | 10/1994 | Hisamoto ............... G11C 11/40 365/149 |
| 7,419,881 B2 | | 9/2008 | Cho et al. |

(Continued)

OTHER PUBLICATIONS

Chen et al., An Access-Transistor-Free (0t/1R) Non-Volatile Resistance Random Access Memory (RRAM) Using a Novel Threshold Switching, Self-Rectifying Chalcogenide Device, Electron Devices Meeting, Dec. 8-10, 2003, abstract only.

(Continued)

*Primary Examiner* — Nikolay K Yushin
(74) *Attorney, Agent, or Firm* — TraskBritt

(57) ABSTRACT

A semiconductor structure includes stack structures. Each of the stack structures comprises a first conductive material, a chalcogenide material over the first conductive material, a second conductive material over the chalcogenide material, and a first dielectric material between the chalcogenide material and the first conductive material and between the chalcogenide material and the second conductive material. The semiconductor structure further comprises a second dielectric material on at least sidewalls of the chalcogenide material. The chalcogenide material may be substantially encapsulated by one or more dielectric materials. Related semiconductor structures and related methods are disclosed.

18 Claims, 12 Drawing Sheets

Related U.S. Application Data continuation of application No. 15/692,387, filed on Aug. 31, 2017, now Pat. No. 10,128,437.

(52) U.S. Cl.
CPC ........ *H01L 45/1233* (2013.01); *H01L 45/143* (2013.01); *H01L 45/144* (2013.01); *H01L 45/1608* (2013.01); *H01L 45/1675* (2013.01); *H01L 27/2463* (2013.01)

(58) Field of Classification Search
CPC ... H01L 45/144; H01L 45/143; H01L 45/141; H01L 27/2463; H01L 27/1157; H01L 27/11521; H01L 27/115; H01L 27/2436; H01L 27/11551
See application file for complete search history.

(56) References Cited

U.S. PATENT DOCUMENTS

| | | |
|---|---|---|
| 7,646,559 B1 | 1/2010 | Cheung et al. |
| 7,772,067 B2 | 8/2010 | Lee et al. |
| 7,888,665 B2 | 2/2011 | Happ et al. |
| 7,932,509 B2 | 4/2011 | Chen et al. |
| 8,847,186 B2 | 9/2014 | Redaelli et al. |
| 9,484,196 B2 | 11/2016 | Song et al. |
| 2006/0110888 A1 | 5/2006 | Cho et al. |
| 2009/0127535 A1 | 5/2009 | Chen et al. |
| 2010/0044669 A1 | 2/2010 | Happ et al. |
| 2016/0056208 A1 | 2/2016 | Pellizzer et al. |
| 2017/0125097 A1 | 5/2017 | Tortorelli et al. |

OTHER PUBLICATIONS

Ciocchini et al., "Bipolar switching in chalcogenide phase change memory", 2016, Scientific Reports, 6:29162, pp. 1-9, published Jul. 5, 2016.

Collins et al., U.S. Patent Application filed May 16, 2016, tilled Semiconductor Structures including Liners and Related Methods., U.S. Appl. No. 15/155,618.

* cited by examiner

MEMORY DEVICES AND ELECTRONIC DEVICES INCLUDING MEMORY MATERIALS SUBSTANTIALLY ENCAPSULATED WITH DIELECTRIC MATERIALS

CROSS-REFERENCE TO RELATED APPLICATIONS

This application is a continuation of U.S. patent application Ser. No. 16/185,829, filed, Nov. 9, 2018, now U.S. Pat. No. 10,600,960, issued on Mar. 24, 2020, which is a continuation of U.S. patent application Ser. No. 15/692,387, filed Aug. 31, 2017, titled "SEMICONDUCTOR STRUCTURES INCLUDING MEMORY MATERIALS SUBSTANTIALLY ENCAPSULATED WITH DIELECTRIC MATERIALS, AND RELATED SYSTEMS AND METHODS," now U.S. Pat. No. 10,128,437, issued Nov. 13, 2018, the disclosure of each of which is hereby incorporated herein in its entirety by this reference.

TECHNICAL FIELD

Embodiments disclosed herein relate to semiconductor structures including memory materials substantially encapsulated by one or more dielectric materials, to related memory cells, and to methods of forming such semiconductor structures and memory cells. More particularly, embodiments of the disclosure relate to semiconductor structures and memory cells including memory materials substantially encapsulated with an aluminum oxide dielectric material, to methods of forming such semiconductor structures and memory cells, to memory devices including such cells, and to systems including such devices.

BACKGROUND

Nonvolatile memory devices are an important element of electronic systems due to their ability to maintain data absent a power supply. Some nonvolatile memory cells include phase change materials. Phase change materials include chalcogenide compounds that are capable of stably transitioning between physical states (e.g., amorphous, semi-amorphous, and crystalline states). Each physical state of the phase change material may exhibit a particular resistance that may be used to distinguish a logic value of the memory cell. Conventional memory cells including the phase change materials may also include a selector device, such as a switching diode, a threshold switching material, another isolation element, etc.

A semiconductor structure including an array of memory cells may include memory cells located at an intersection between conductive access lines, such as between a conductive word line and a conductive bit line. For example, three-dimensional (3D) cross-point memory devices may include memory cells arranged in an array and including rows of access lines and columns of access lines that may be arranged in a pattern of rows and columns. During operation of the semiconductor structure, data may be written to and read from the memory cells. A particular memory cell may be accessed through the conductive access lines in direct electrical communication with that particular memory cell.

Fabrication of conventional semiconductor structures including such memory cells often includes creating high aspect ratio openings in a stack of materials to form stack structures. Frequently, materials that are highly sensitive to downstream processing conditions are used as part of the stack structures. For example, chalcogenide materials of the phase change material may be damaged at temperatures used during conventional semiconductor fabrication processes or may react with etchant or deposition chemistries used during downstream processing. Elements of the chalcogenide materials may also diffuse out of the chalcogenide material during etching or material formation (e.g., deposition) act. In some situations, as a result of undesired interactions of the chalcogenide material with other materials in the stack, the chalcogenide material may undesirably have a different composition after fabrication of the semiconductor structure than an as-deposited chalcogenide material. Accordingly, patterning the stack structures and associated memory elements may result in undesirable effect such as damaging and contaminating sidewalls of the stack structures being patterned.

DETAILED DESCRIPTION

Figure 1A:
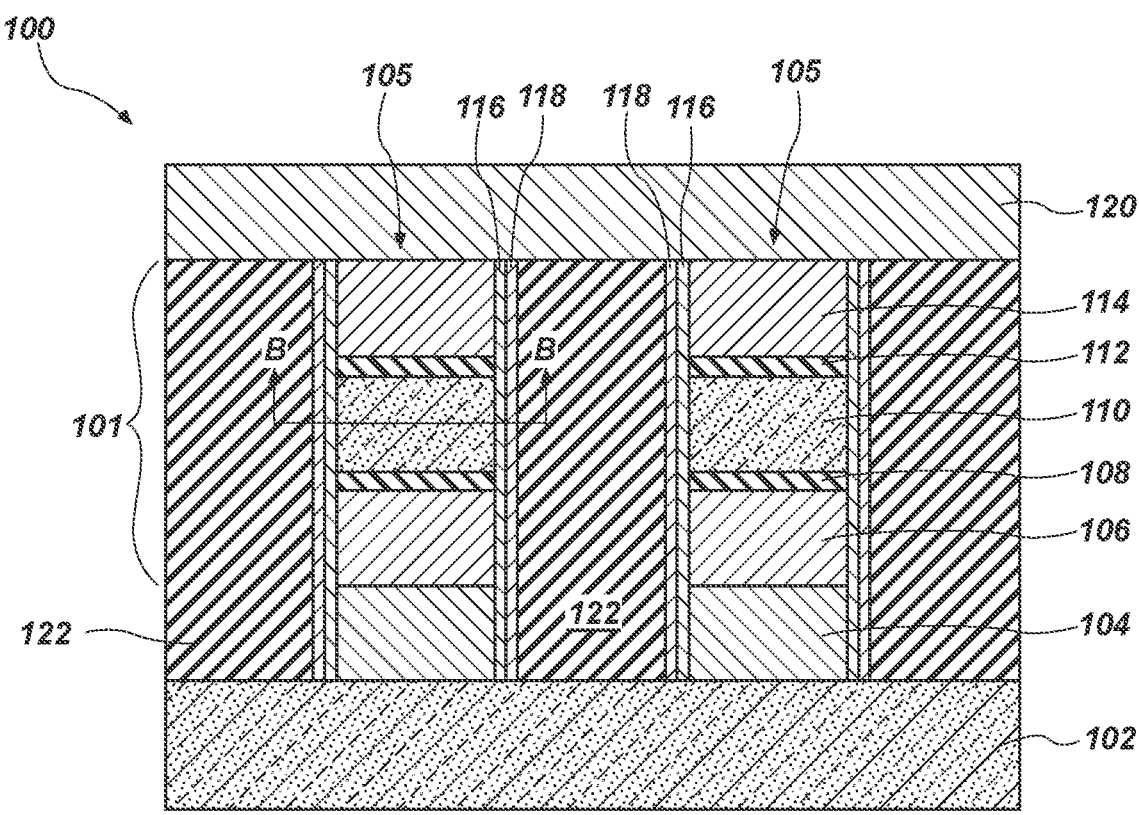
FIG. 1A is a simplified cross-sectional view of a semiconductor structure including memory cells including a self-selecting memory material, in accordance with some embodiments of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or memory cell including a liner material, or a complete description of a process flow for manufacturing such semiconductor structures and memory cells. The structures described below do not form a complete semiconductor structure or a complete memory cell including the liner material. Only those process acts and structures necessary to understand the embodiments described herein are described in detail below. Additional acts to form a complete semiconductor structure or memory cell including the structures described herein may be performed by conventional techniques.

As used herein, the term "self-selecting memory material" means and includes a memory material formulated and configured to act as both a selector device (e.g., a switch, a threshold switching material, etc.) and a memory material (e.g., a memory element) formulated and configured to exhibit one or more states (e.g., physical states) that may correlate to a logic state of an associated memory cell. A self-selecting memory material may exhibit bipolar features wherein a first logic state may be written to the self-selecting memory material by applying a write pulse having a first polarity across the memory cell and a second logic state may be written to the self-selecting memory material by applying a write pulse having a second polarity across the memory cell. During read operations, a threshold voltage ($V_{TH}$) of the memory cell may depend on a polarity direction with which the memory cell was programmed. Stated another way, the threshold voltage may depend on whether a direction of polarity of the read current is the same or different direction than a polarity of the write voltage. In some embodiments, memory cells including the self-selecting memory material may not include both a select device and a memory material, but may include a single material formulated and configured to act as a select device and the memory material. In some such embodiments, the memory cell may comprise or consist essentially of a first electrode, a self-selecting memory material over the first electrode, a second electrode over the self-selecting memory material, and one or more dielectric materials.

As used herein, a material that is "encapsulated" means and includes a material that is surrounded on all sides thereof with one or more materials with which it is encapsulated. For example, a material encapsulated with a dielectric material is surrounded on all sides thereof (i.e., a top, a bottom, and all sides thereof) with the dielectric material. The material that encapsulates the encapsulated material may directly contact the encapsulated material on all sides thereof. As used herein, the terms "substantially encapsulated" and "substantially surrounded" mean and include structures encapsulated and surrounded by a dielectric material to an extent sufficient to preclude damage to or diffusion of the encapsulated material during processing and interaction of the encapsulated material with other adjacent materials on an opposite side of the dielectric material therefrom.

According to embodiments disclosed herein, a semiconductor structure may include memory cells disposed between first conductive access lines and second conductive access lines. The memory cells may include a first electrode over a first conductive access line, a self-selecting memory material over the first electrode, and second electrode over the self-selecting memory material. The self-selecting memory material may comprise a chalcogenide material. In some embodiments, the self-selecting memory material may be encapsulated by one or more dielectric materials. For example, a first dielectric material may be disposed between the first electrode and the self-selecting memory material and a second dielectric material may be disposed between the self-selecting memory material and the second electrode. In some embodiments, the first dielectric material and the second dielectric material comprise the same material, such as aluminum oxide. A liner comprising one or more dielectric materials may overlie sidewalls of the memory cells, such as at least sidewalls of the self-selecting memory material. Accordingly, the self-selecting memory material may be substantially encapsulated on all sides thereof (i.e., above, below, and on all sidewalls thereof) by one or more dielectric materials. In other words, all portions of the self-selecting memory material may be in direct contact with a dielectric material. In some embodiments, the dielectric materials substantially (e.g., fully) surrounding the self-selecting memory material may improve performance of memory cells including with the encapsulated self-selecting memory material. In some embodiments, the memory cells including the encapsulated self-selecting memory material may exhibit an increased read window, a reduced amount of variation of threshold voltage for each memory cell in an array of memory cells, a reduction in the drift bias of the memory cells when the memory cells are biased, and an increased endurance of the memory cells.

FIG. 1 is a cross-sectional view of a semiconductor structure 100, according to embodiments of the disclosure. The semiconductor structure 100 may include a plurality of stack structure 105 over a substrate 102. The substrate 102 may be a base material or a construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

A conductive material 104 may overlie the substrate 102. Each stack structure 105 may be at least partially defined by a memory cell 101. The memory cells 101 may include a first electrode 106 over the conductive material 104, a first dielectric material 108 over the first electrode 106, a self-selecting memory material 110 over the first dielectric material 108, a second dielectric material 112 over the self-selecting memory material 110, and a second electrode 114 over the second dielectric material 112.

In some embodiments, the first electrode 106 may directly overlie and contact the conductive material 104. The first dielectric material 108 may overlie and contact the first electrode 106. In some embodiments, the first dielectric material 108 may directly overlie and directly contact the first electrode 106. The self-selecting memory material 110 may overlie the first dielectric material 108. In some embodiments, the self-selecting memory material 110 may directly overlie and directly contact the first dielectric material 108. Accordingly, in some embodiments, the first dielectric material 108 may intervene between and directly contact each of the first electrode 106 and the self-selecting memory material 110.

The second dielectric material 112 may overlie the self-selecting memory material 110. In some embodiments, the second dielectric material 112 may directly overlie and directly contact the self-selecting memory material 110. A second electrode 114 may overlie the second dielectric material 112. In some embodiments, the second electrode 114 directly overlies and directly contacts the second dielectric material 112. Another conductive material 120 may directly overlie and directly contact the second electrode 114 of a plurality of the stack structure 105.

The conductive material 104 may include any electrically conductive material including, but not limited to, tungsten, aluminum, copper, titanium, tantalum, platinum, alloys thereof, heavily doped semiconductor material, polysilicon, a conductive silicide, a conductive nitride, a conductive carbide, or combinations thereof. In some embodiments, the conductive material 104 is tungsten. In some embodiments, the conductive material 104 may comprise an access line, such as a word line.

The first electrode 106 and the second electrode 114 may each comprise the same material or different materials. The first electrode 106 and the second electrode 114 may include a conductive material such as, for example, tungsten, platinum, palladium, tantalum, nickel, titanium nitride (TiN), tantalum nitride (TaN), tungsten nitride (WN), polysilicon, a metal silicide, or a carbon material. In some embodiments, one or both of the first electrode 106 and the second electrode 114 comprises carbon.

The self-selecting memory material 110 may comprise a chalcogenide material, such as a chalcogenide glass, a chalcogenide-metal ion glass, or other chalcogenide-containing materials. As used herein, the term "chalcogenide material" means and includes a binary or multinary (ternary, quaternary, etc.) compound including at least one chalcogenide atom and at least one more electropositive element. As used herein, the term "chalcogenide" means and includes an element of Group VI of the Periodic Table, such as oxygen (O), sulfur (S), selenium (Se), or tellurium (Te). The electropositive element may include, but is not necessarily limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. In some embodiments, the chalcogenide material includes a compound including Ge, Sb, and Te (i.e., a GST compound), such as $Ge_2Sb_2Te_5$, however, the disclosure is not so limited and the chalcogenide material may include other compounds including at least one chalcogenide element. In some embodiments, the chalcogenide material may be doped or undoped and may have metal ions mixed therein. By way of nonlimiting example, suitable chalcogenide alloys may include alloys including indium, selenium, tellurium, antimony, arsenic, bismuth, germanium, oxygen, tin, or combinations thereof.

In some embodiments, the chalcogenide material may be a phase change material. In some embodiments, the self-selecting memory material 110 may include a ternary compound including selenium, arsenic, and germanium. In other embodiments, the self-selecting memory material 110 may include a quaternary compound including silicon, selenium, arsenic, and germanium.

The first dielectric material 108 may be formulated and configured to prevent or reduce the self-selecting memory material 110 from reacting with the first electrode 106. In some embodiments, the first dielectric material 108 may include a material formulated and configured to inhibit or even prevent diffusion of materials of the self-selecting memory material 110 into the first electrode 106. In some embodiments, the first dielectric material 108 directly contacts each of the first electrode 106 and the self-selecting memory material 110.

The first dielectric material 108 may include any dielectric material that is substantially unreactive with each of the self-selecting memory material 110 and the first electrode 106. The first dielectric material 108 may include high-k metal oxides such as refractory metal oxides, an oxynitride such as $SiO_xN_y$, wherein x is between about 1 and about 4 and y is between about 1 and about 4, aluminum oxynitride ($AlO_xN_y$, wherein x is between about 0 and about 1.0 and y is between about 0 and about 1.0), nitrides (e.g., silicon nitride, aluminum nitride, hafnium nitride, zirconium nitride, etc.), carbon oxynitride ($CN_xO_y$, wherein x is between about 0 about 1.0 and y is between about 0 and about 1.0), and combinations thereof.

By way of non-limiting example, the first dielectric material 108 may include aluminum oxide ($Al_2O_3$), a compound including aluminum, silicon, and oxygen (aluminum silicon oxide ($AlSi_xO_y$)), magnesium oxide ($MgO_x$), strontium oxide (SrO), barium oxide (BaO), lanthanum oxide ($LaO_x$), lutetium oxide ($LuO_x$), dysprosium scandium oxide ($DySc_yO_x$), strontium titanium oxide ($SrTiO_3$, also known as STO), aluminum oxynitride ($AlO_xN_y$), a refractory metal oxide, such as hafnium oxide ($HfO_x$), iridium oxide ($IrO_x$), titanium oxide ($TiO_x$), tantalum oxide ($Ta_xO_5$, such as $Ta_2O_5$), zirconium oxide ($ZrO_2$), niobium oxide ($Nb_xO_y$, such as NbO, $NbO_2$, or $Nb_2O_5$), molybdenum oxide, a refractory metal alloy oxide, such as hafnium oxynitride ($HfO_xN_y$) and hafnium silicon oxide ($HfSi_xO_y$), and combinations thereof, wherein x is between about 0 and about 6.0 and y is between about 0 and about 6.0. As used herein, the term "refractory metal alloy oxide" means and includes a compound including a refractory metal, oxygen, and at least one other element. The at least one other element may be another refractory metal. In some embodiments, the first dielectric material 108 comprises aluminum oxide. In other embodiments, the first dielectric material 108 includes more than one dielectric material, such as a first portion of a high-k dielectric material and a second portion of another high-k dielectric material.

The first dielectric material 108 may extend substantially continuously between the first electrode 106 and the self-selecting memory material 110 such that the first electrode 106 does not physically contact the self-selecting memory material 110. Thus, the first dielectric material 108 may physically isolate the first electrode 106 from the self-selecting memory material 110.

A thickness of the first dielectric material 108 may be sufficient to cover exposed portions of the first electrode 106. However, the thickness of the first dielectric material 108 may not be so thick that the first dielectric material 108 exhibits tunneling characteristics and undesirably increases an electrical resistance across the associated memory cell 101. The thickness of the first dielectric material 108 may be between about 2 Å and about 50 Å, such as between about 2 Å and about 3 Å, between about 3 Å and about 5 Å, between about 5 Å and about 10 Å, between about 10 Å and about 20 Å, between about 20 Å and about 30 Å, or between about 30 Å and about 50 Å. In some embodiments, the thickness of the first dielectric material 108 is between about 2 Å and about 5 Å. In some embodiments, the first dielectric material 108 may comprise a monolayer.

The second dielectric material 112 may directly contact each of the self-selecting memory material 110 and the second electrode 114. The second dielectric material 112 may be formulated and configured to prevent or reduce the self-selecting memory material 110 from reacting with the second electrode 114 and may prevent or reduce diffusion of the self-selecting memory material 110 into the second electrode 114.

The second dielectric material 112 may include any dielectric material that is substantially chemically unreactive with each of the self-selecting memory material 110 and the second electrode 114. The second dielectric material 112 may include one or more of the same materials described above with reference to the first dielectric material 108. In some embodiments, the second dielectric material 112 comprises aluminum oxide. In other embodiments, the second dielectric material 112 comprises the same material as the first dielectric material. In some such embodiments, the first dielectric material 108 and the second dielectric material 112 may each comprise aluminum oxide.

A thickness of the second dielectric material 112 may extend substantially continuously between the self-selecting memory material 110 and the second electrode 114 such that the self-selecting memory material 110 does not physically contact the second electrode 114. Thus, the second dielectric material 112 may physically isolate the self-selecting memory material 110 from the second electrode 114.

The second dielectric material 112 may be sufficient to cover exposed portions of the self-selecting memory material 110. However, the thickness of the second dielectric material 112 may not be so thick that the second dielectric material 112 exhibits tunneling characteristics and undesirably increases an electrical resistance across the associated memory cell 101.

The thickness of the second dielectric material 112 may be between about 2 Å and about 50 Å, such as between about 2 Å and about 3 Å, between about 3 Å and about 5 Å, between about 5 Å and about 10 Å, between about 10 Å and about 20 Å, between about 20 Å and about 30 Å, or between about 30 Å and about 50 Å. In other embodiments, the thickness of the second dielectric material 112 is between about 2 Å and about 5 Å. In yet other embodiments, the second dielectric material 112 may comprise a monolayer of the second dielectric material 112. In some embodiments, the first dielectric material 108 and the second dielectric material 112 have the same thickness. In some other embodiments, each of the first dielectric material 108 and the second dielectric material 112 may have a thickness of about one monolayer.

Sidewalls of the memory cells 101 may be lined with one or more dielectric materials. In some embodiments, a first liner 116 may be on sidewalls of the stack structure 105 and extend from the substrate 102 to the another conductive material 120. The first liner 116 may overlie and contact each of the conductive material 104, the first electrode 106, the first dielectric material 108, the self-selecting memory material 110, the second dielectric material 112, and the second electrode 114.

The first liner 116 may comprise a dielectric material, such as an oxide material, a nitride material, or an oxynitride material. By way of nonlimiting example, the first liner 116 may comprise silicon dioxide, silicon nitride, silicon oxynitride, a spin-on dielectric material, borophosphosilicate glass (BPSG), borosilicate glass (BSG), or another dielectric material. In some embodiments, the first liner 116 comprises silicon dioxide. In other embodiments, the first liner 116 comprises silicon nitride. In other embodiments, the first liner 116 comprises a same material as the first dielectric material 108 and the second dielectric material 112. In some such embodiments, the first liner 116 may comprise aluminum oxide.

A thickness of the first liner 116 may be between about 1 nm and about 10 nm, such as between about 1 nm and about 3 nm, between about 3 nm and about 5 nm, or between about 5 nm and about 10 nm.

A second liner 118 may overlie the first liner 116. In some embodiments, the second liner 118 may be coextensive with the first liner 116 and may directly overlie and directly contact the first liner 116. Stated another way, the second liner 118 may extend from the substrate 102 to the another conductive material 120. In other embodiments, the second liner 118 may overlie the first liner 116 only at regions corresponding to sidewalls of the self-selecting memory material 110.

The second liner 118 may include a dielectric material, such as a high-k dielectric material, formulated and configured to form a seal between the materials of the stack structures 105 and moisture or other contaminants during processing of the semiconductor structure 100. By way of nonlimiting example, the second liner 118 may include aluminum oxide, hafnium oxide, zirconium oxide, another high-k dielectric material, silicon dioxide, silicon nitride, silicon carbon nitride (SiCN), silicon oxynitride ($SiO_xN_y$), silicon carboxynitride (SiOCN), or combinations thereof. In some embodiments, the second liner 118 comprises aluminum oxide.

The second liner 118 may have a thickness between about 1 nm and about 10 nm, such as between about 1 nm and about 3 nm, between about 3 nm and about 5 nm, or between about 5 nm and about 10 nm.

An insulative material 122 may fill spaces between the stack structures 105 and may contact the second liner 118 on adjacent sidewalls of the stack structures 105. Accordingly, the insulative material 122 may extend from the second liner 118 of a first stack structure 105 to the second liner 118 of an adjacent stack structure 105.

The insulative material 122 may include any material formulated and configured to exhibit electrically insulative properties. By way of nonlimiting example, the insulative material 122 may include silicon dioxide, silicon nitride, silicon oxynitride, a spin-on dielectric material, BPSG, BSG, or another dielectric material. In some embodiments, the insulative material 122 comprises silicon dioxide.

Figure 1B:
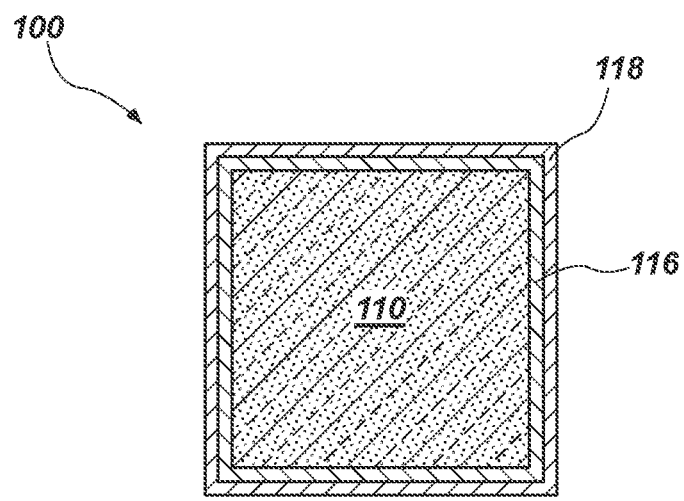
FIG. 1B is a planar view of the semiconductor structure of FIG. 1A taken along section line B-B of FIG. 1A.

FIG. 1B is a cross-sectional view of the semiconductor structure 100 taken along section line B-B of FIG. 1A. As shown in FIG. 1B, the first liner 116 and the second liner 118 may form a seal substantially surrounding the self-selecting memory material 110. In some embodiments, the entire stack structure 105 (FIG. 1A) may be encapsulated with the first liner 116 and the second liner 118. In other words, all portions (e.g., sides) of the self-selecting memory material 110 may be in direct contact with a dielectric material. In other embodiments, the first liner 116 and the second liner 118 substantially surround only the self-selecting memory material 110. In some other embodiments, the combination of the first liner 116, the second liner 118, the first dielectric material 108, and the second dielectric material 112 may substantially encapsulate the self-selecting memory material 110. Accordingly, in some embodiments, all sides of the self-selecting memory material 110 may be surrounded by a dielectric material, such as one or more of aluminum oxide and silicon dioxide, silicon nitride, or another dielectric material.

Although FIG. 1A and FIG. 1B have been described as including the first liner 116 and the second liner 118, the disclosure is not so limited. In other embodiments, the semiconductor structure 100 may not include two liners, but may include only the first liner 116. In some such embodiments, the first liner 116 may include aluminum oxide. In some such embodiments, the self-selecting memory material 110 may be substantially encapsulated with a dielectric material comprising aluminum oxide. Stated another way, a top, a bottom, and substantially all sides (e.g., sidewalls) of the self-selecting memory material 110 may be surrounded by and in direct contact with a dielectric material (e.g., the first dielectric material 108, the second dielectric material 112, and the first liner 116) comprising aluminum oxide.

Figure 1C:
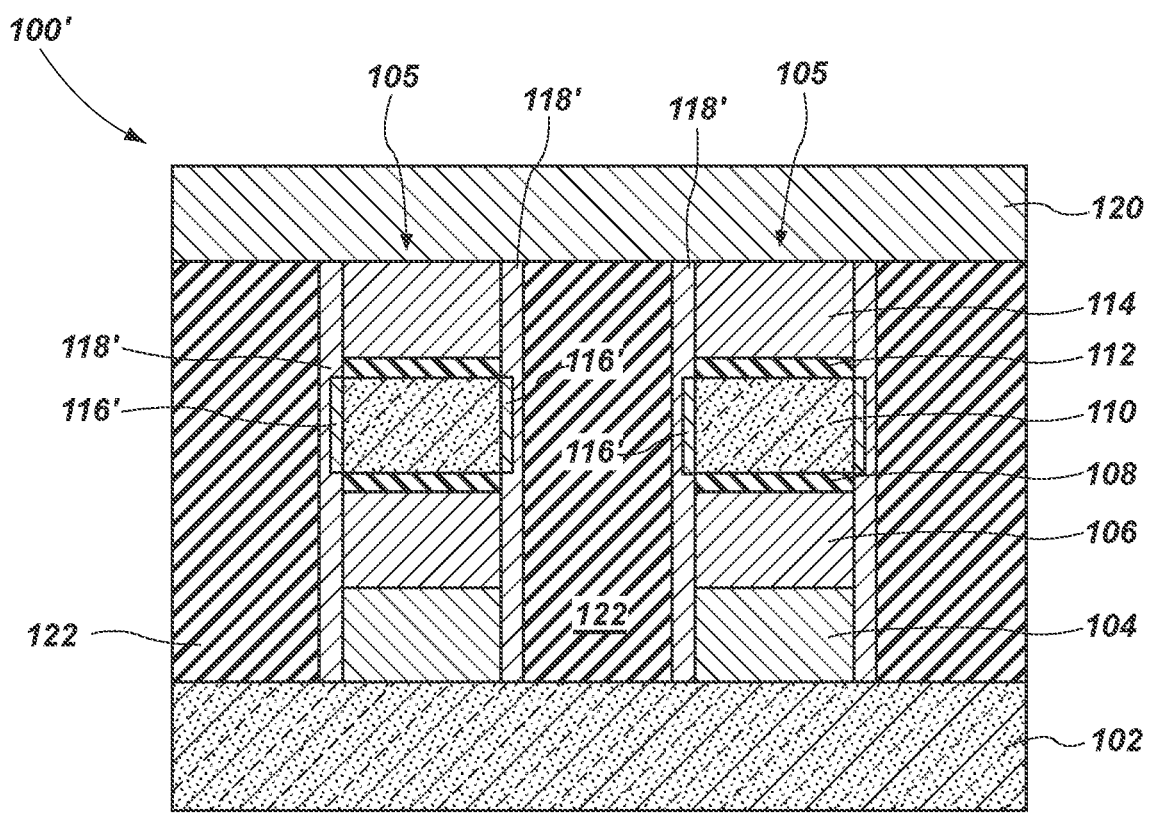
FIG. 1C is a simplified cross-sectional view of a semiconductor structure including memory cells including a self-selecting memory material, in accordance with some embodiments of the disclosure.

Although the memory cell 101 of FIG. 1A and FIG. 1B have been described as including the first liner 116 directly on sidewalls of the stack structures 105 and the second liner 118 directly on the first liner 116, the disclosure is not so limited. In other embodiments, the second liner may overlie the first liner only at regions corresponding to sidewalls of the self-selecting memory material. FIG. 1C is a semiconductor structure 100' including a self-selecting memory material 110 surrounded by dielectric materials, in accordance with some embodiments of the disclosure. The self-selecting memory material 110 may be surrounded by the first dielectric material 108 and the second dielectric material 112 and the first liner 116' on sidewalls thereof. In some embodiments, the first liner 116' may overlie only sidewalls of the self-selecting memory material 110. In other embodiments, the first liner 116' may overlie the self-selecting memory material 110 and at least a portion of the first dielectric material 108 and the second dielectric material 112. In yet other embodiments, the first liner 116' may overlie the self-selecting memory material 110, the first dielectric material 108, the second dielectric material 112, at least a portion of the second electrode 114, and at least a portion of the first electrode 106. In some such embodiments, the first liner 116' may not extend from the conductive material 104 to the another conductive material 120. A second liner 118' may overlie the first liner 116' and may overlie sidewalls of the stack structures 105 other than self-selecting memory material 110. In other words, the second liner 118' may contact sidewalls of the conductive material 104, the first electrode 106, the first dielectric material 108, the first liner 116', the second dielectric material 112, and the second electrode 114. The first liner 116' and the second liner 118' may comprise the same material as the first liner 116 and the second liner 118 described with reference to FIG. 1A.

Although the semiconductor structure 100 has been described as including the first electrode 106 and the second electrode 114, the disclosure is not so limited. In other embodiments, the semiconductor structure 100 may not include the first electrode 106 and the second electrode 114. In some such embodiments, the first dielectric material 108 may directly overlie and contact the conductive material 104 and the another conductive material 120 may directly overlie and contact the second dielectric material 112. In some such embodiments, the stack structure 105 may include the first dielectric material 108 directly over the conductive material 104, the self-selecting memory material 110 over the first dielectric material 108, the second dielectric material 112 over the self-selecting memory material 110, and the another conductive material directly over the second dielectric material 112.

Accordingly, in some embodiments, a semiconductor structure comprises stack structures. Each stack structure comprises a first conductive material, a chalcogenide material over the first conductive material, a second electrode over the chalcogenide material, and a first dielectric material between the chalcogenide material and the first conductive material and between the chalcogenide material and the second conductive material. The semiconductor structure further comprises a second dielectric material on at least sidewalls of the chalcogenide material.

Accordingly, in some embodiments, a semiconductor structure comprises at least one memory cell. The at least one memory cell comprises a first conductive material, a self-selecting memory material comprising a chalcogenide material, a second conductive material, a first dielectric material between the first conductive material and the chalcogenide material and between the second conductive material and the chalcogenide material, and a liner on sidewalls of the chalcogenide material. The liner comprises a first portion comprising a second dielectric material in contact with the chalcogenide material, and a second portion over the first portion, the second portion comprising the same material as the first dielectric material.

Figure 2A:
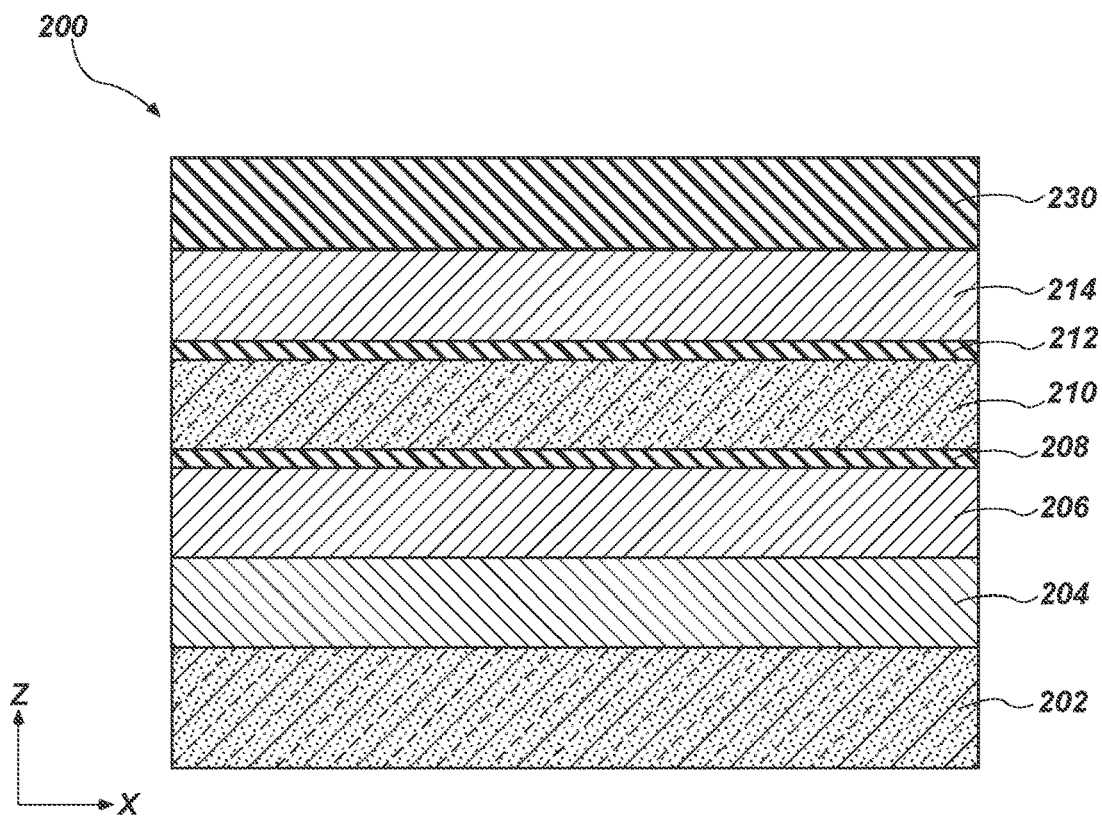
FIG. 2A through FIG. 2J illustrate a method of forming the semiconductor structure, in accordance with some embodiments of the disclosure.

Referring to FIG. 2A through FIG. 2J a method of forming the semiconductor structure 100 described above with reference to FIG. 1A and FIG. 1B is described. Referring to FIG. 2A, forming a semiconductor structure 200 may include forming a first conductive material 204 (which may comprise an access line, such as, for example, a word line or a bit line) over a substrate 202, forming a first electrode material 206 over the first conductive material 204, forming a first dielectric material 208 over the first electrode material 206, forming a self-selecting memory material 210 over the first dielectric material 208, forming a second dielectric material 212 over the self-selecting memory material 210, and forming a second electrode material 214 over the second dielectric material 212. Each of the substrate 202, the first conductive material 204, the first electrode material 206, the first dielectric material 208, the self-selecting memory material 210, the second dielectric material 212, and the second electrode material 214 may be substantially similar to the substrate 102, the conductive material 104, the first electrode 106, the first dielectric material 108, the self-selecting memory material 110, the second dielectric material 112, and the second electrode 114 described above with reference to FIG. 1A.

A hard mask material 230 may be formed over the second electrode material 214. The hard mask material 230 may include a material exhibiting an etch selectivity relative to the materials in a stack structure 205. In some embodiments, the hard mask material 230 may include silicon nitride or other suitable mask material for forming patterns in the semiconductor structure 200.

In some embodiments, the first dielectric material 208 and the second dielectric material 212 may include aluminum oxide.

Each of the first conductive material 204, the first electrode material 206, the first dielectric material 208, the self-selecting memory material 210, the second dielectric material 212, and the second electrode material 214 may be formed by techniques such as physical vapor deposition (PVD), chemical vapor deposition (CVD), atomic layer deposition (ALD), plasma-enhanced chemical vapor deposition (PECVD), low pressure chemical vapor deposition (LPCVD), or other deposition methods. In some embodiments, the first dielectric material 208 and the second dielectric material 212 may be formed by PVD.

Figure 2B:
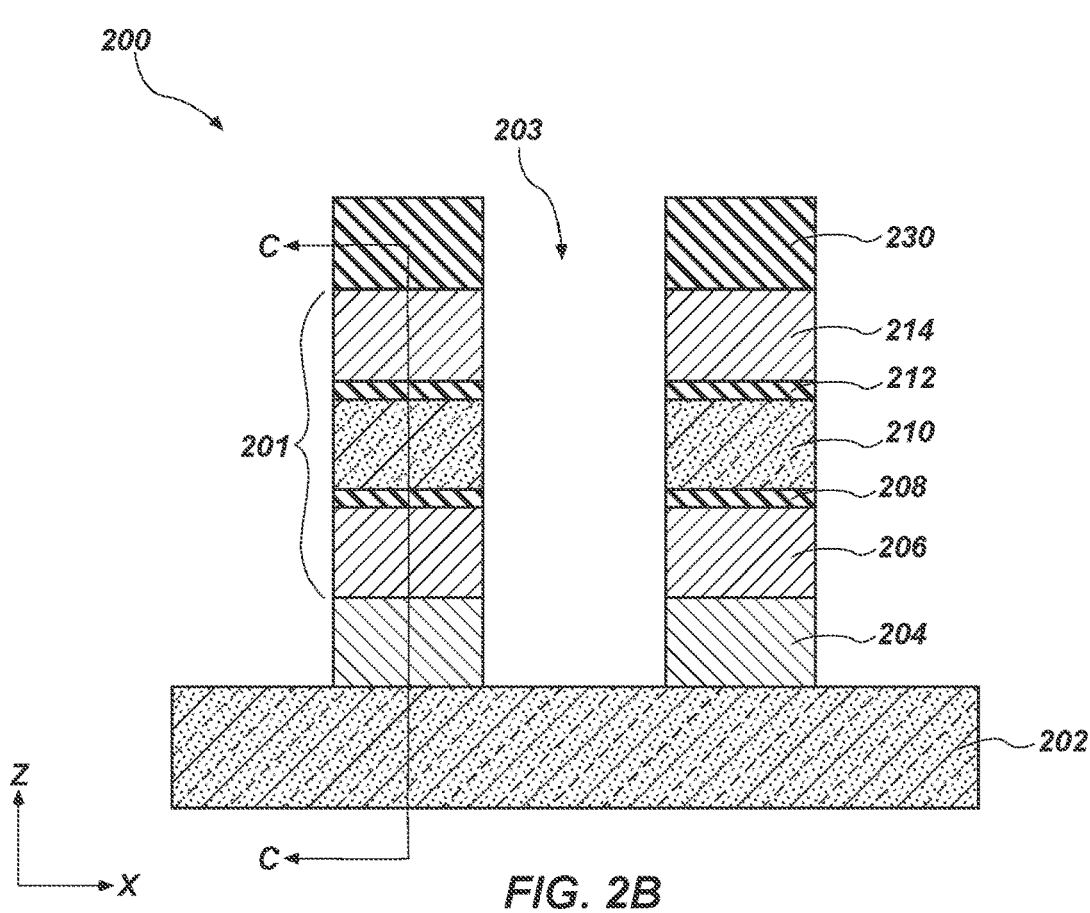
Figure 2C:
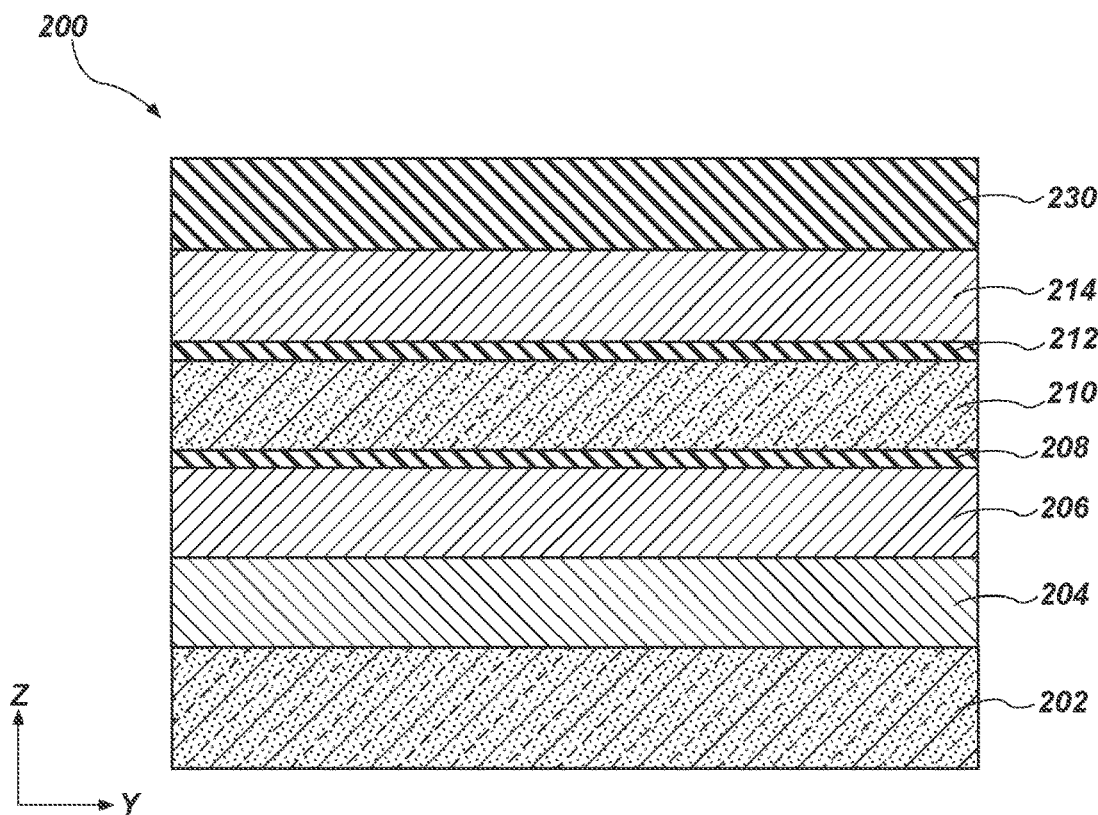

FIG. 2B is a cross-sectional view of the semiconductor structure 200 after further processing of the structure of FIG. 2A. FIG. 2C is a cross-sectional view of the semiconductor structure 200 taken along section line C-C of FIG. 2B. Referring to FIG. 2B and FIG. 2C, a portion of the hard mask material 230, the second electrode material 214, the second dielectric material 212, the self-selecting memory material 210, the first dielectric material 208, the first electrode material 206, and the first conductive material 204 may be removed to expose a portion of the substrate 202 and to form line structures 201 and trenches 203 between adjacent line structures 201. The line structures 201 and the trenches 203 may extend in a first direction (e.g., in a y-direction). The hard mask material 230 and the line structures 201 may be patterned through a mask or reticle (not shown) by conventional techniques, which are not described in detail herein.

The patterned hard mask material 230 may be used as a mask to remove underlying portions of the second electrode material 214, the second dielectric material 212, the self-selecting memory material 210, the first dielectric material 208, the first electrode material 206, and the first conductive material 204 to form the line structures 201. The line structures 201 may be formed by an isotropic etch process, such as by dry plasma etching or reactive ion etching. Adjacent line structures 201 may be separated from each other by a distance between about 10 nm and about 30 nm, such as between about 10 nm and about 15 nm, between about 15 nm and about 20 nm, or between about 20 nm and about 30 nm, although the disclosure is not limited to such distances.

Figure 2D:
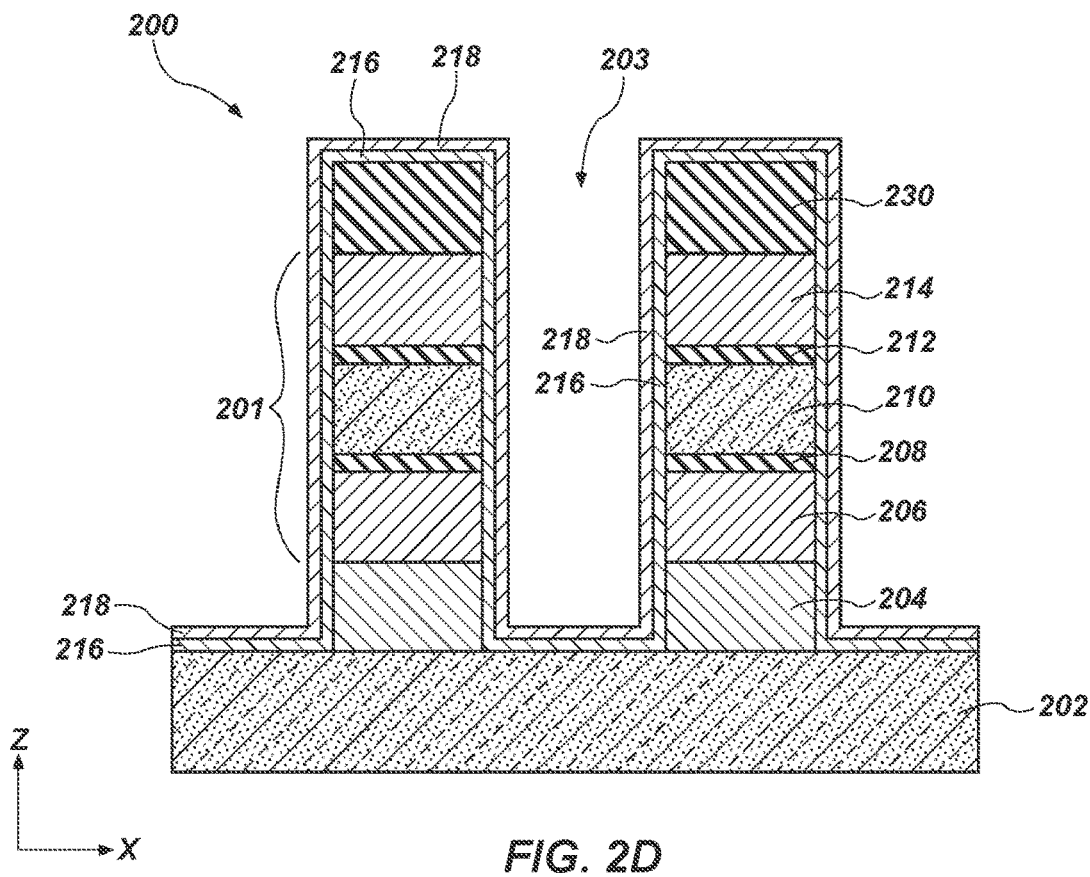

Referring to FIG. 2D, a first liner material 216 and a second liner material 218 may be formed over the stack structures 205 and over surfaces of the substrate 202 between the line structures 201. In some embodiments, the first liner material 216 and the second liner material 218 may be conformally formed over the line structures 201. The first liner material 216 may be formed such that it substantially covers sidewalls of at least the self-selecting memory material 210 and may, in some embodiments, substantially cover sidewalls of the entire line structures 201. The second liner material 218 may be formed such that it substantially covers the first liner material 216 over sidewalls of at least the self-selecting memory material 210 and may, in some embodiments, be formed to substantially cover all of the first liner material 216 on sidewalls of the line structures 201.

The first liner material 216 may be substantially the same as the first liner 116 described above with reference to FIG. 1A. By way of nonlimiting example, the first liner material 216 may include a dielectric material such as an oxide material, a nitride material, or an oxynitride material. By way of nonlimiting example, the first liner material 216 may comprise silicon dioxide, silicon nitride, silicon oxynitride, a spin-on dielectric material, borophosphosilicate glass (BPSG), borosilicate glass (BSG), or another dielectric material. In some embodiments, the first liner material 216 comprises silicon dioxide. In other embodiments, the first liner material 216 comprises silicon nitride. The first liner material 216 may be formed to a thickness between about 1 nm and about 10 nm.

The second liner material 218 may be substantially the same as the second liner 118 described above with reference to FIG. 1A. For example, the second liner material 218 may include a dielectric material, such as a high-k dielectric material such as aluminum oxide, hafnium oxide, zirconium oxide, another high-k dielectric material, silicon dioxide, silicon nitride, silicon carbon nitride (SiCN), silicon oxynitride ($SiO_xN_y$), silicon carboxynitride (SiOCN), or combinations thereof. In some embodiments, the second liner material 218 comprises aluminum oxide. The second liner material 218 may be formed to a thickness between about 1 nm and about 10 nm.

The first liner material 216 and the second liner material 218 may be formed by ALD, CVD, PECVD, LPCVD, PVD, or other film deposition processes. In some embodiments, the first liner material 216 and the second liner material 218 may be formed by ALD or PVD.

Figure 2E:
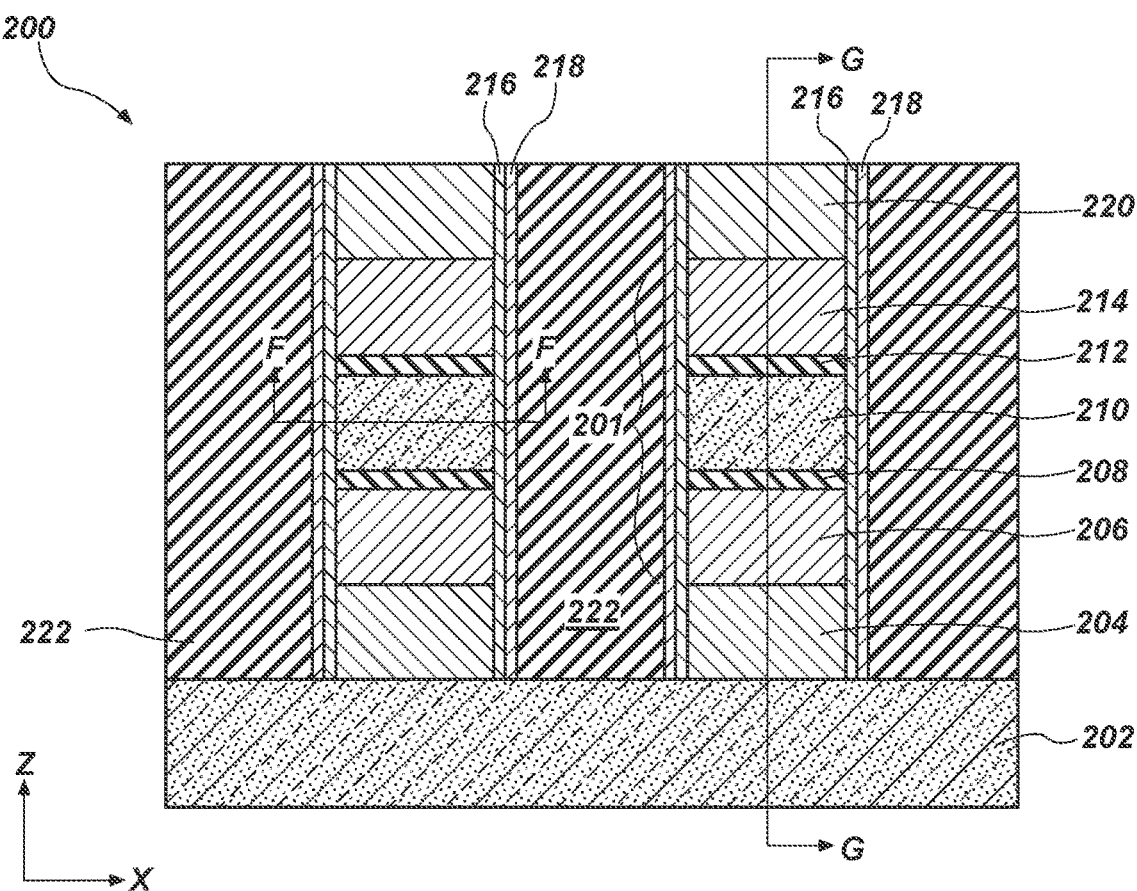

Referring to FIG. 2E, horizontal portions of the first liner material 216 and the second liner material 218 may be removed from an uppermost horizontal portion of the line structures 201 and from over surfaces of the substrate 202 between adjacent line structures 201 such that sidewalls thereof remain covered with the first liner material 216 and the second liner material 218. By way of nonlimiting example, the second liner material 218 and the first liner material 216 may be exposed to a dry plasma etch, such as reactive ion etching. In some embodiments, the second liner material 218 and the first liner material 216 may be exposed to an etchant such as a chlorine ($Cl_2$) based dry etch chemistry, a boron trichloride ($BCl_3$) based etch chemistry, or a combination thereof. In some embodiments, the hard mask material 230 may be removed from the line structures 201.

Trenches 203 (FIG. 2D) between adjacent line structures 201 may be filled with an insulative material 222, which may be substantially the same as the insulative material 122 described above with reference to FIG. 1A. In some embodiments, the insulative material 222 may include silicon dioxide. After forming the insulative material 222, the insulative material 222 may be planarized, such as by chemical mechanical planarization (CMP) such that an upper portion of the insulative material 222 is coplanar with an upper portion of a second conductive material 220.

Figure 2F:
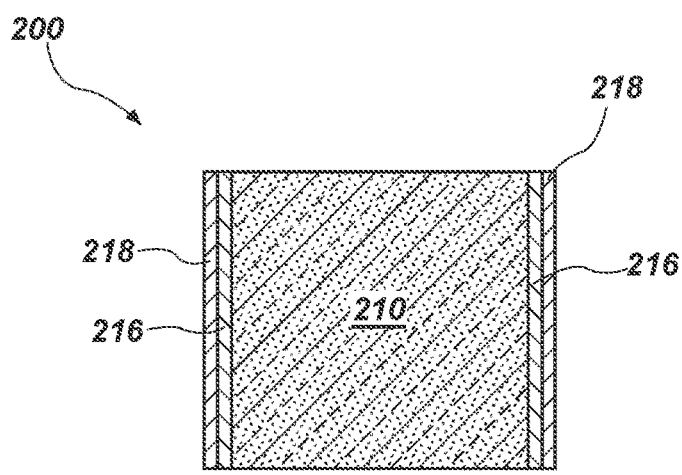

FIG. 2F is a planar view of the semiconductor structure 200 taken along section line F-F of FIG. 2E. The semiconductor structure 200 may include the first liner material 216 and the second liner material 218 disposed on opposing sidewalls of the self-selecting memory material 210.

Figure 2G:
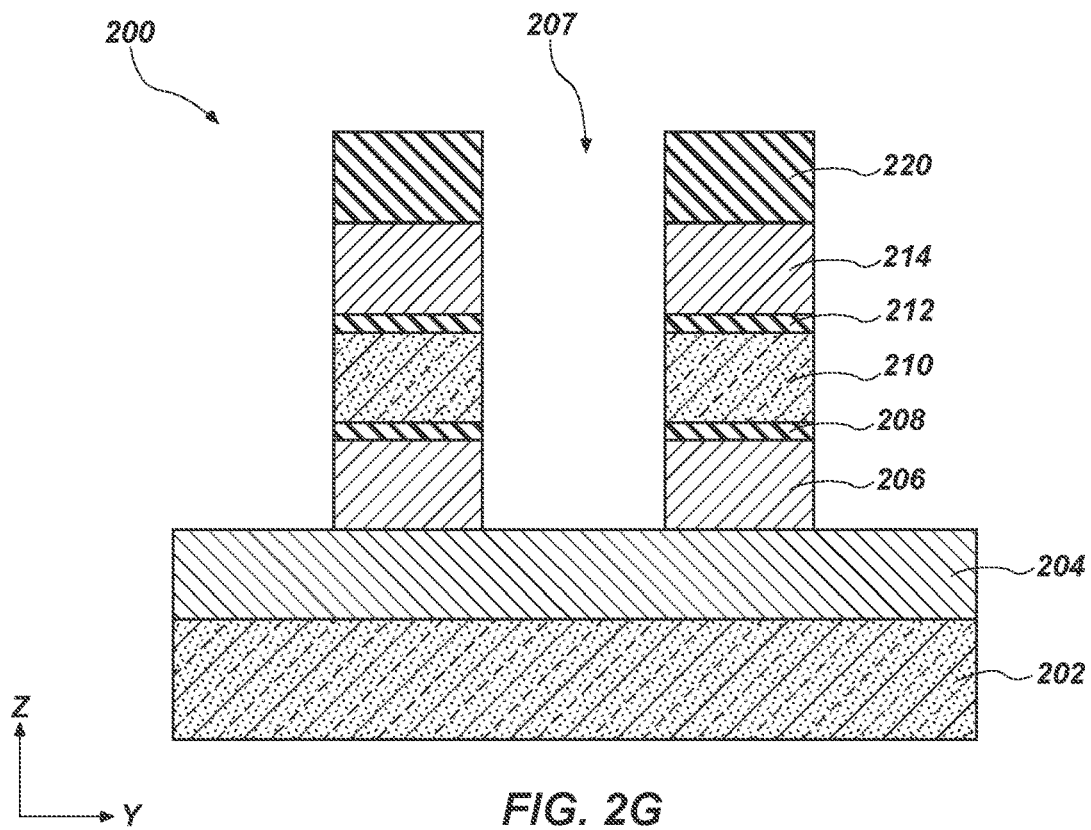

FIG. 2G is a cross-sectional view of the semiconductor structure 200 taken along section line G-G of FIG. 2E. As shown in FIG. 2G, a second conductive material 220 (which may comprise an access line, such as, for example, a word line or a bit line) may be formed and patterned over the second electrode material 214 of each line structure 201 (FIG. 2E). Portions of the line structures 201 and the insulative material 222 may be removed to form isolated stack structures 205 separated by trenches 207. The trenches 207 may extend in a second direction (e.g., the x-direction) that, in some embodiments, may be substantially perpendicular to the direction in which the trenches 203 extend. In some embodiments, portions of each of the second conductive material 220, the second electrode material 214, the second dielectric material 212, the self-selecting memory material 210, the first dielectric material 208, and the first electrode material 206 may be removed from each of the adjacent line structures 201. Each of the materials may be removed such as by reactive ion etching. In some embodiments, portions of the first conductive material 204 may not be removed such that they extend in a direction that is substantially perpendicular to a direction in which the second conductive material 220 extends.

Figure 2H:
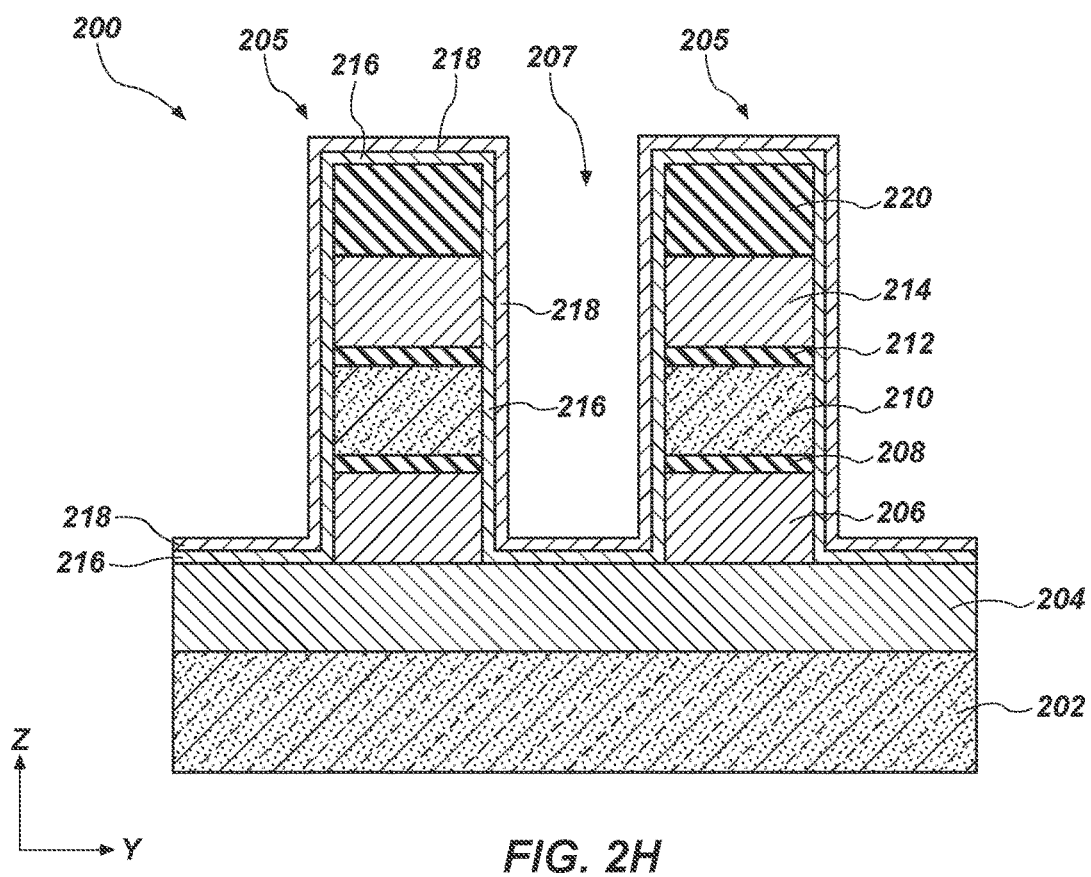

Referring to FIG. 2H, the first liner material 216 and the second liner material 218 may be formed over the stack structures 205. In some embodiments, the first liner material 216 and the second liner material 218 may be conformally formed over the stack structures on exposed sidewalls of the stack structures 205. The first liner material 216 may overlie sidewalls of the isolated stack structures 205 that were not covered by the first liner material 216 previously. In other words, the first liner material 216 may overlie sidewalls of the isolated stack structures 205 located about perpendicularly from the sidewalls thereof previously covered with the first liner material 216. In some embodiments, the first liner material 216 may include silicon dioxide. The second liner material 218 may be conformally formed over the isolated stack structures 205. The second liner material 218 may overlie sidewalls of the stack structures 205 that were not covered by the second liner material 218 previously. The first liner material 216 and the second liner material 218 may be the same as described above.

Figure 2I:
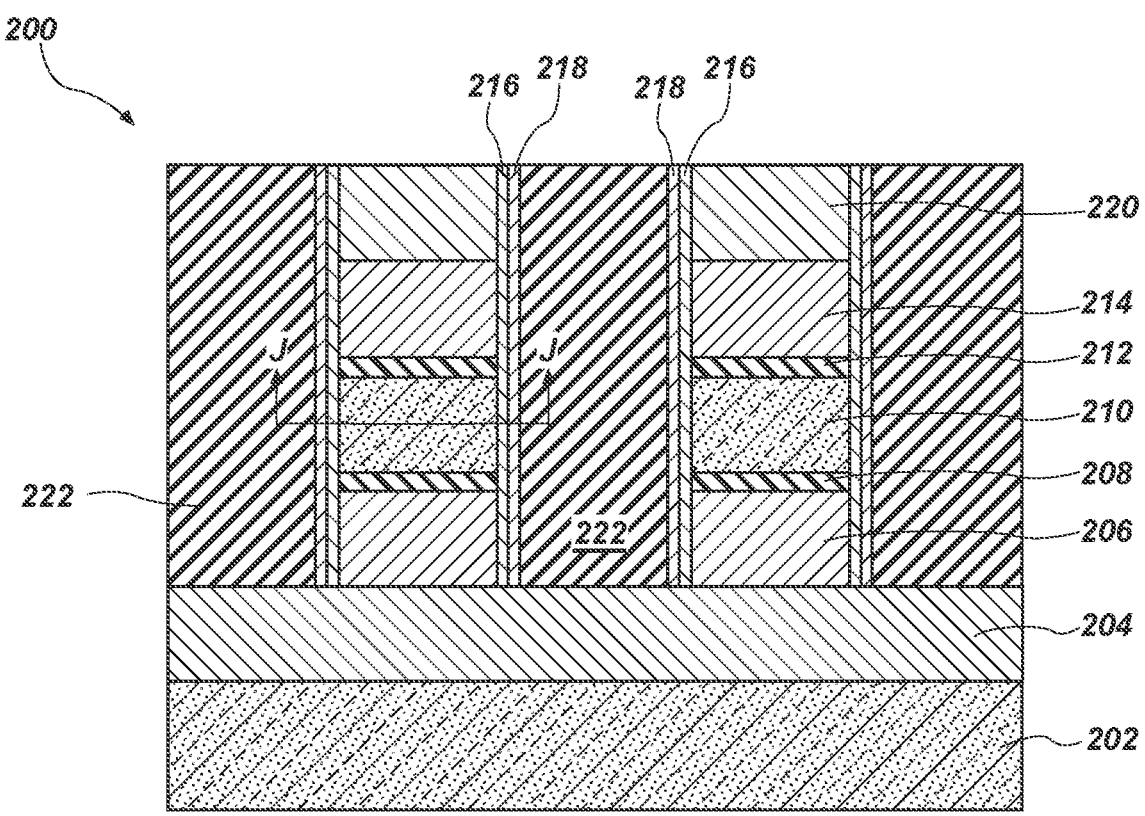

Referring to FIG. 2I, after forming the first liner material 216 and the second liner material 218 over the stack structure 205, horizontal portions of the first liner material 216 and the second liner material 218 may be removed from surfaces of the substrate 202 and from horizontal surfaces of the second conductive material 220 such as by a dry etching process. The hard mask material 230 may be removed from the stack structures 205 to form a semiconductor structure 200 similar to the semiconductor structure 100 described above with reference to FIG. 1A and FIG. 1B. Accordingly, the semiconductor structure 200 may include a self-selecting memory material 210 that is substantially encapsulated by one or more dielectric materials on all sides thereof. After removing horizontal portions of the first liner material 216 and the second liner material 218, an insulative material 222 may be formed in the trenches 207 (FIG. 2H) between the stack structures 205.

Although FIG. 2I has been described as including the first electrode material 206 and the second electrode material 214, in some embodiments, the semiconductor structure 200 may not include the first electrode material 206 and the second electrode material 214. In some such embodiments, the first dielectric material 208 may directly contact and overlie the first conductive material 204 and the second conductive material 220 may directly overlie and contact the second dielectric material 212.

Figure 2J:
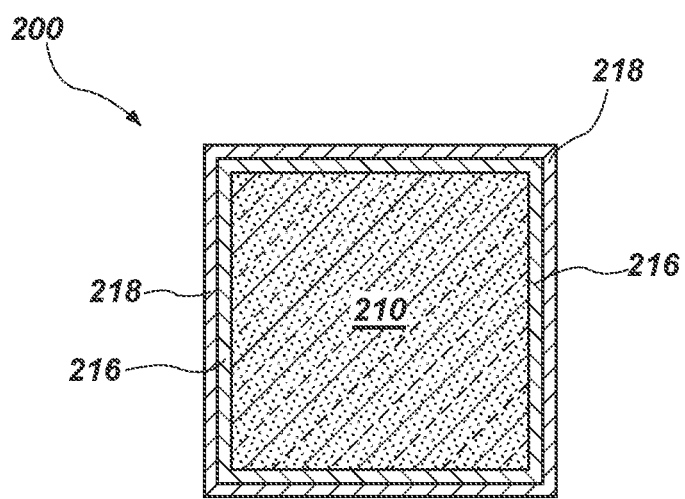

FIG. 2J is a planar view of the semiconductor structure 200 taken along section line J-J of FIG. 2I. The first liner material 216 and the second liner material 218 may substantially surround sidewalls of the self-selecting memory material 210 and the stack structures 205 (FIG. 2I).

Accordingly, in some embodiments, a method of forming a semiconductor structure comprises forming a first dielectric material over a first conductive material, forming a chalcogenide material over the first dielectric material, forming a second dielectric material over the chalcogenide material, forming a second conductive material over the second dielectric material, removing portions of the second conductive material, the second dielectric material, the chalcogenide material, and the first dielectric material to form line structures extending in a first direction, forming a liner material over at least sidewalls of the line structures, removing portions of the second conductive material, the second dielectric material, the chalcogenide material, and the first dielectric material in a second direction to form isolated stack structures, and forming another liner material over sidewalls of the isolated stack structures to form a substantially encapsulated chalcogenide material in each stack structure.

Figure 3:
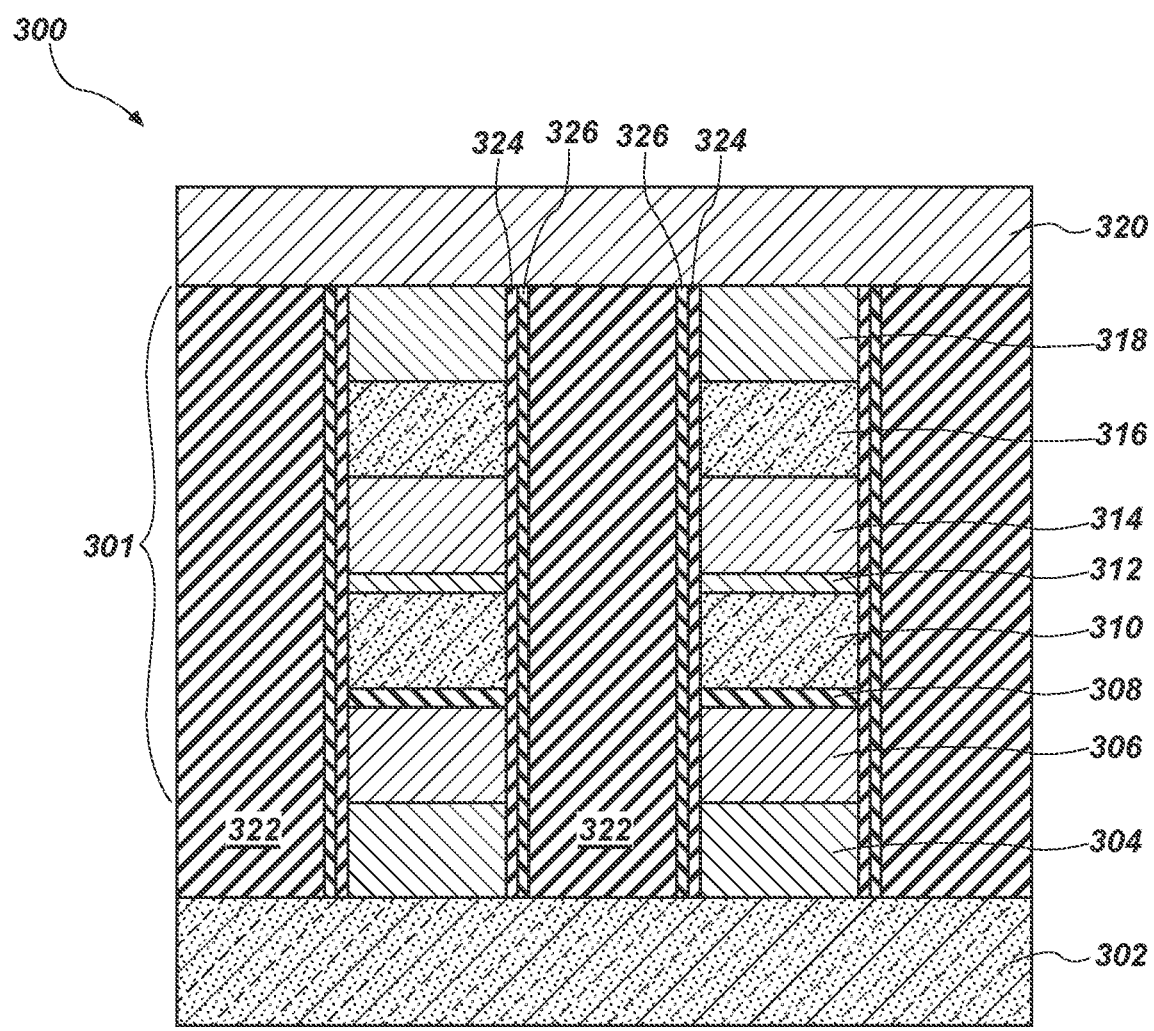
FIG. 3 is a simplified cross-sectional view of a semiconductor structure including a plurality of memory cells, in accordance with some embodiments of the disclosure.

Although the memory cell 101 of FIG. 1A has been described as comprising or consisting essentially of the first electrode 106, the first dielectric material 108, the self-selecting memory material 110, the second dielectric material 112, and the second electrode 114, the disclosure is not so limited. Referring to FIG. 3, in other embodiments, a semiconductor structure 300 may include a separate switching device 310 and a memory material 316. For example, the semiconductor structure 300 may include a memory cell 301 formed over a substrate 302, the memory cell 301 comprising a first electrode 306 over a conductive material 304 (e.g., a word line or a bit line), a first dielectric material 308 over the first electrode 306, a switching device 310 over the first dielectric material 308, a second dielectric material 312 over the switching device 310, a second electrode 314 over the second dielectric material 312, a memory material 316 over the second electrode 314, and a third electrode 318 over the memory material 316. The first electrode 306, the second electrode 314, and the third electrode 318 may be substantially the same as the first electrode 106 and the second electrode 114 described above with reference to FIG. 1A. The first dielectric material 308 and the second dielectric material 312 may be substantially the same as the first dielectric material 108 and the second dielectric material 112 described above with reference to FIG. 1A.

The switching device 310 and the memory material 316 may comprise a chalcogenide material, such as a chalcogenide-metal ion glass, a chalcogenide glass, or other materials. The chalcogenide material may include one of the same materials described above with reference to the self-selecting memory material 110 described above with reference to FIG. 1A.

Another conductive material 320 (e.g., a word line or a bit line) may overlie each of the memory cells 301. A first liner 324 and a second liner 326 may overlie sidewalls of the memory cells 301 and may include the same materials described above with reference to the first liner 116 and the second liner 118 described above with reference to FIG. 1A and FIG. 1B. The conductive material 304 and the another conductive material 320 may comprise the same materials described above with reference to the conductive material 104 (FIG. 1) and the another conductive material 120 (FIG. 1). An insulative material 322 may be disposed between adjacent memory cells 101 and may comprise the same materials described above with reference to the insulative material 122 (FIG. 1A).

Although FIG. 3 has been described as including the first electrode 306 and the third electrode 318, the disclosure is not so limited. In some embodiments, the semiconductor structure 300 may not include the first electrode 306 and the third electrode 318. In some such embodiments, the second conductive material 320 may directly overlie and contact the memory material 316 and the first dielectric material 308 may directly overlie and contact the first conductive material 304.

The semiconductor structures including memory cells having an encapsulated self-selecting memory material may exhibit improved electrical properties compared to conventional semiconductor structures. By way of nonlimiting example, the semiconductor structures including the encapsulated self-selecting memory material may exhibit an increased read window, a reduced amount of drift (i.e., drift current) when the memory cell associated with the self-selecting memory material is selected, a reduced amount of drift when the memory cell associated with the self-selecting memory material is biased and in an unselected state (e.g., biased at a voltage having a magnitude lower than a magnitude of the threshold voltage), and an increased endurance.

Figure 4A:
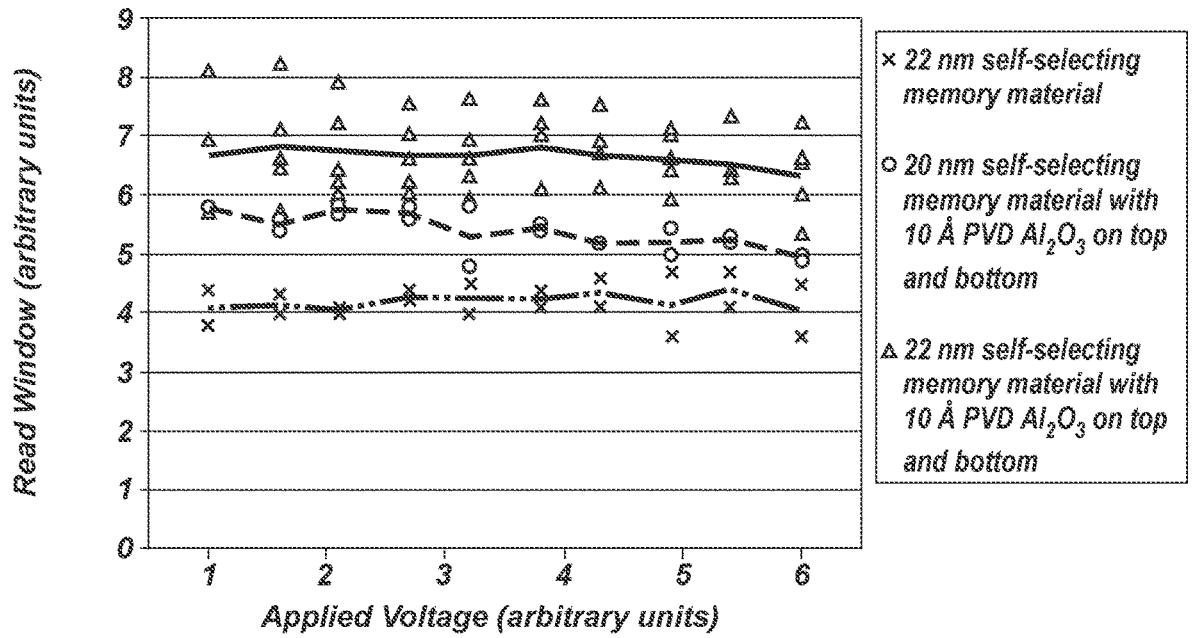
FIG. 4A is a graph illustrating a read window of semiconductor structures including aluminum oxide directly above and below a self-selecting memory material compared to a read window of a conventional semiconductor structure.

FIG. 4A is a graph illustrating a read window of semiconductor structures including an encapsulated self-selecting material compared to a read window of a conventional semiconductor structure. The conventional semiconductor structure included a self-selecting material comprising a chalcogenide material having a thickness of about 22 nm disposed directly between two electrodes. A second semiconductor structure including aluminum oxide having a thickness of about 10 Å over a first electrode comprising carbon, a self-selecting memory material having a thickness of about 20 nm over the aluminum oxide, another aluminum oxide material having a thickness of about 10 Å over the self-selecting memory material, and a second electrode comprising carbon over the another aluminum oxide material was formed. The aluminum oxide materials were formed by physical vapor deposition. A third semiconductor structure was formed and was substantially the same as the second semiconductor structure except that the self-selecting memory material of the third semiconductor structure had a thickness of about 22 nm. As shown in FIG. 4A, the second semiconductor structure and the third semiconductor structure according to embodiments of the disclosure exhibited an increase in read window relative to the conventional semiconductor structure. For example, the read window of the second semiconductor structure exhibited an increase of between about 20% and about 40% relative to the read window of the conventional semiconductor structure. The read window of the third semiconductor structure exhibited an increase of between about 70% and about 80% relative to the read window of the conventional semiconductor structure.

Figure 4B:
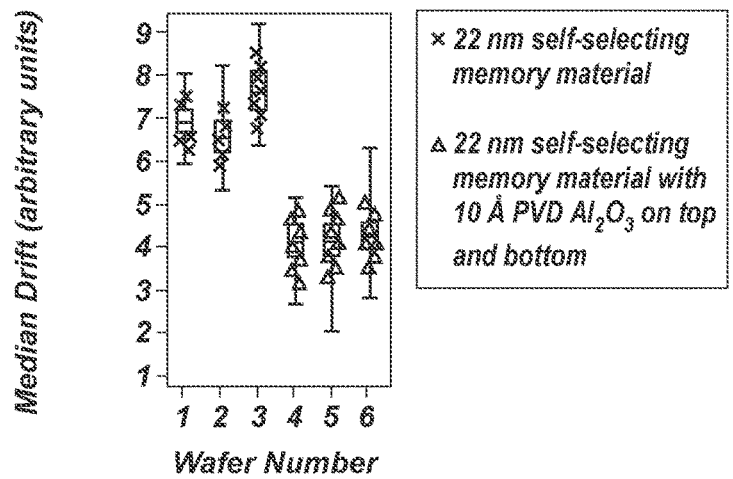
FIG. 4B is a graph comparing a drift of semiconductor structures including conventional memory cells and semiconductor structures including aluminum oxide directly above and below a self-selecting memory material.

FIG. 4B is a graph comparing a drift of semiconductor structures including conventional memory cells to a drift of semiconductor structures including an encapsulated self-selecting memory material. The conventional semiconductor structures were substantially the same as those described above with reference to FIG. 4A. Semiconductor structures including a self-selecting memory material and aluminum oxide above and below the self-selective memory material were formed as described above with reference to the third semiconductor structure described with reference to FIG. 4A. The semiconductor structures including the self-selecting memory material according to embodiments of the disclosure exhibited a reduced amount of drift in threshold voltage over the operating life of the semiconductor structures compared to the conventional semiconductor structures. The memory cells including the aluminum oxide dielectric material in contact with the self-selecting memory material according to embodiments of the disclosure exhibited about 40% less drift in threshold voltage compared to the conventional memory cells.

Figure 4C:
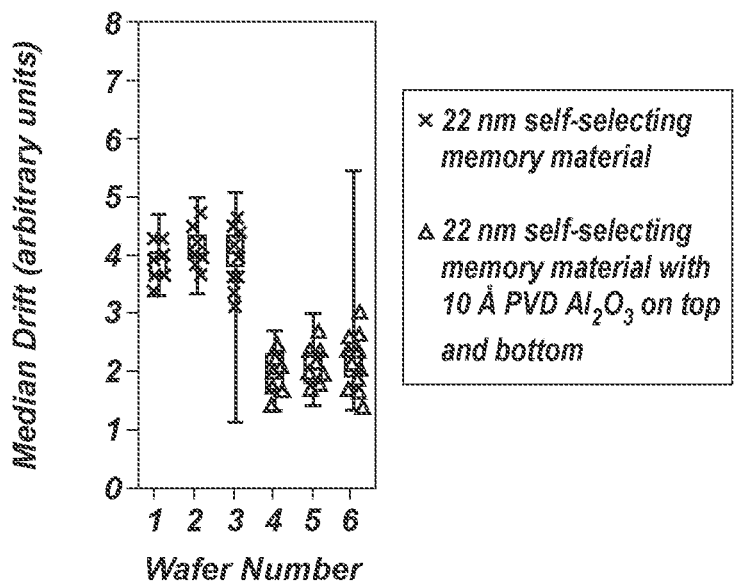
FIG. 4C is a graph illustrating a bias drift of the semiconductor structures including conventional memory cells and semiconductor structures including aluminum oxide directly above and below a self-selecting memory material.

FIG. 4C is a graph illustrating a bias drift of the semiconductor structures described above with reference to FIG. 4B. The bias drift may correspond to an amount of drift of the memory cell when the memory cell is in an unselected state and a biasing voltage is applied thereto. The semiconductor structures including the aluminum oxide dielectric materials according to embodiments of the disclosure exhibited a bias drift of about 40% less than a bias drift of the conventional semiconductor structures not including the aluminum oxide dielectric materials.

Figure 4D:
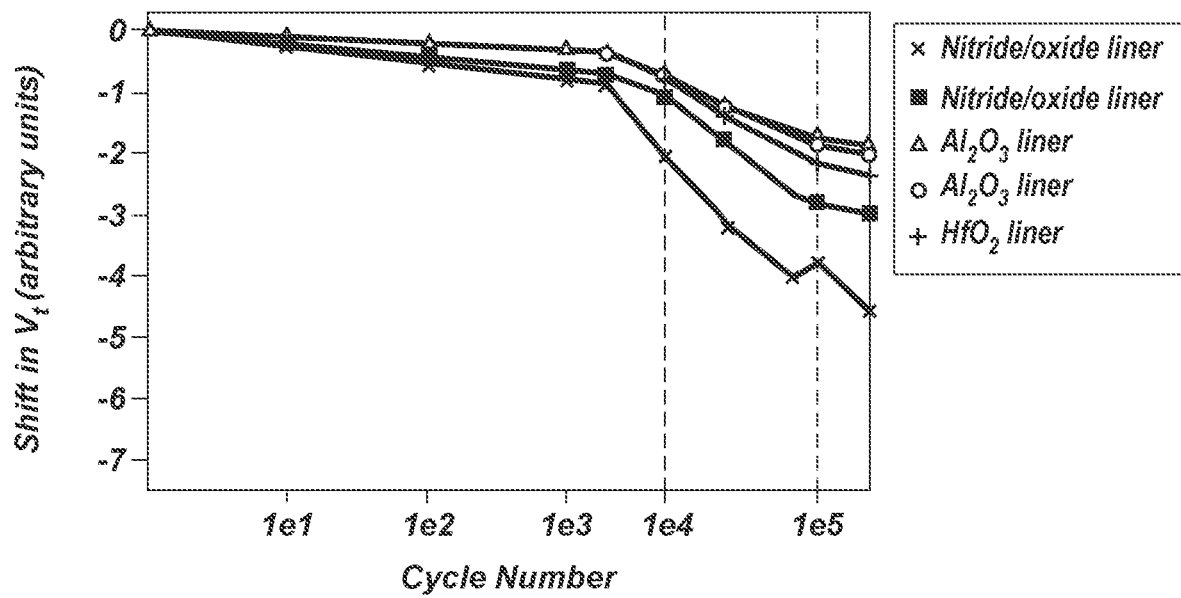
FIG. 4D is a graph comparing an endurance of memory cells including a memory material with different liners on sidewalls thereof, in accordance with some embodiments of the disclosure.

FIG. 4D is a graph comparing an endurance of memory cells including a memory material with different liners on sidewalls thereof, according to embodiments of the disclosure. The memory cells included a memory material over a first electrode, a second electrode over the memory material, and a liner on sidewalls thereof. The liners of each of the memory cells included one of aluminum oxide, hafnium oxide, a liner comprising an oxide and a nitride. With reference to FIG. 4D, the memory cells including the nitride/oxide liner exhibiting an increased shift in threshold voltage required to access the memory cell over the lifetime of the cell compared to the other memory cells including an aluminum oxide liner or a hafnium oxide liner according to embodiments of the disclosure. The memory cells including an aluminum oxide liner material on sidewalls of the memory material exhibited a reduced amount of shift in the threshold voltage as a function of cycle number compared to memory cells including other liner materials. In other words, the memory cells including the aluminum oxide liner according to embodiments of the discourse exhibited a greater endurance (i.e., less shift in threshold voltage required to access the memory cell) than conventional memory cells.

Figure 5:
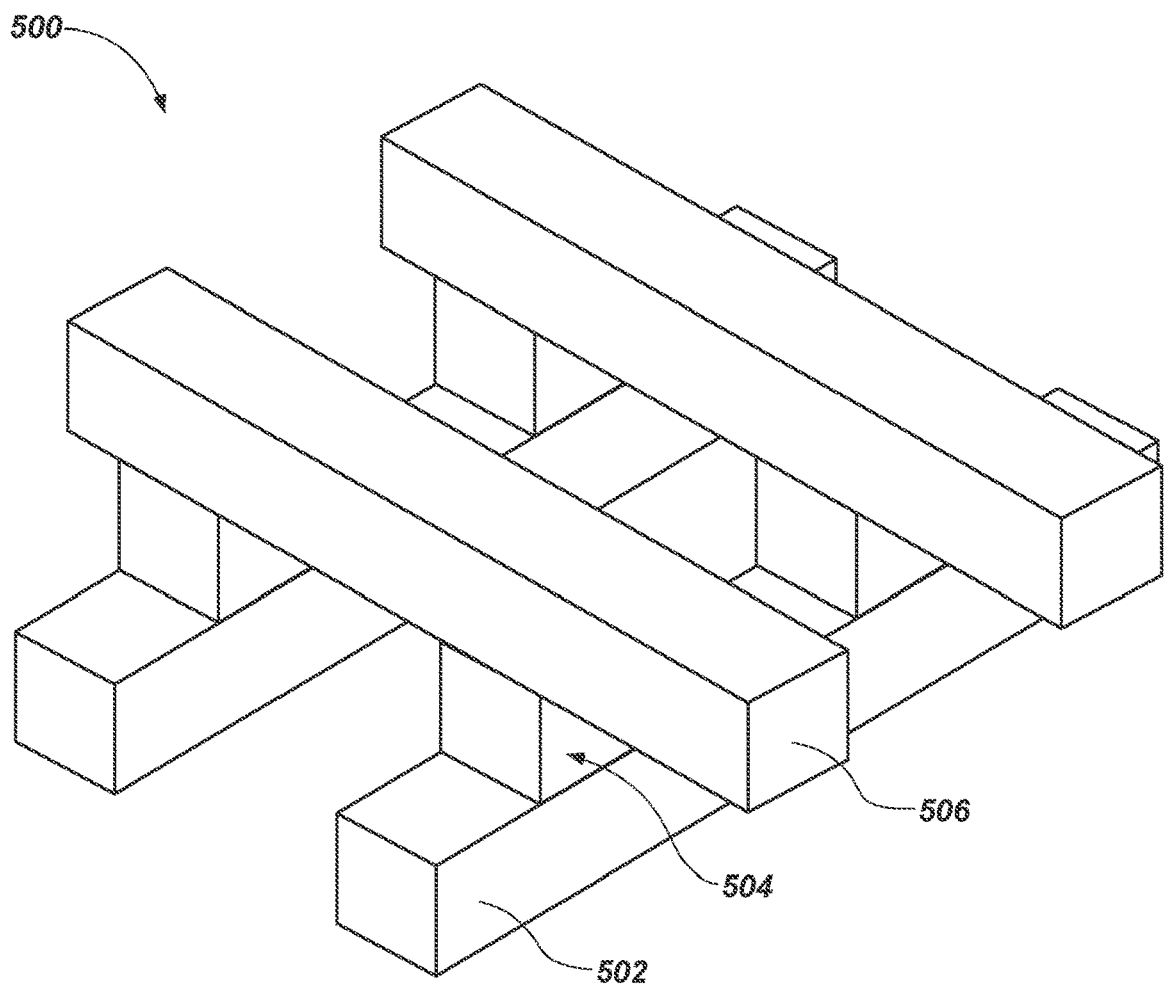
FIG. 5 is a perspective view of a memory cell array including a plurality of memory cells, in accordance with some embodiments of the disclosure.

FIG. 5 illustrates a memory array 500 including a plurality of memory cells 504. The plurality of memory cells 504 may be substantially similar to the memory cells 101 described above with reference to FIG. 1A. The plurality of memory cells 504 may be positioned between a plurality of access lines 502, sometimes also referred to as word lines 502, and a plurality of bit lines 506, sometimes also referred to as digit lines 506. The plurality of access lines 502 may correspond to the conductive material 104 of FIG. 1A and the plurality of bit lines 506 may correspond to the another conductive material 120 of FIG. 1A. The plurality of bit lines 506 may directly overlie a row or column of stack structures and contact the top electrode thereof. Each of the access lines 502 may extend in a first direction and may connect a row of the memory cells 504. Each of the bit lines 506 may extend in a second direction that is at least substantially perpendicular to the first direction and may connect a column of the phase change memory cells 504. A voltage applied to the access lines 502 and the bit lines 506 may be controlled such that an electric field may be selectively applied at an intersection of at least one access line 502 and at least one bit line 506, enabling the phase change memory cells 504 to be selectively operated. Accordingly, a memory device may include the memory array 500.

Figure 6:
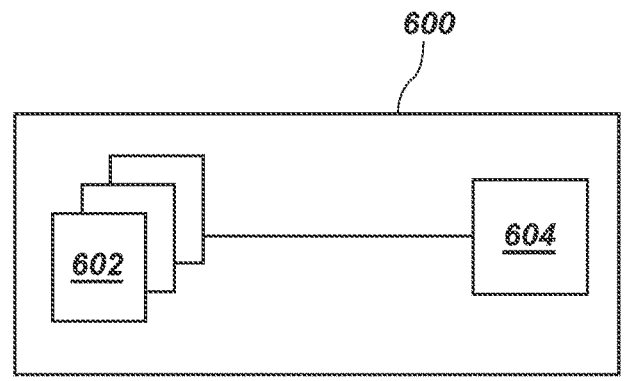
FIG. 6 is a simplified block diagram of a semiconductor structure including memory cells having an encapsulated self-selecting memory material, in accordance with some embodiments of the disclosure.

FIG. 6 is a simplified block diagram of a semiconductor device 600 implemented according to one or more embodiments described herein. The semiconductor device 600 includes a memory array 602 and a control logic component 604. The memory array 602 may include a plurality of memory cells 101, as described above with reference to FIG. 1A. The control logic component 604 may be configured to operatively interact with the memory array 602 so as to read from or write to any or all memory cells 101 within the memory array 602.

Figure 7:
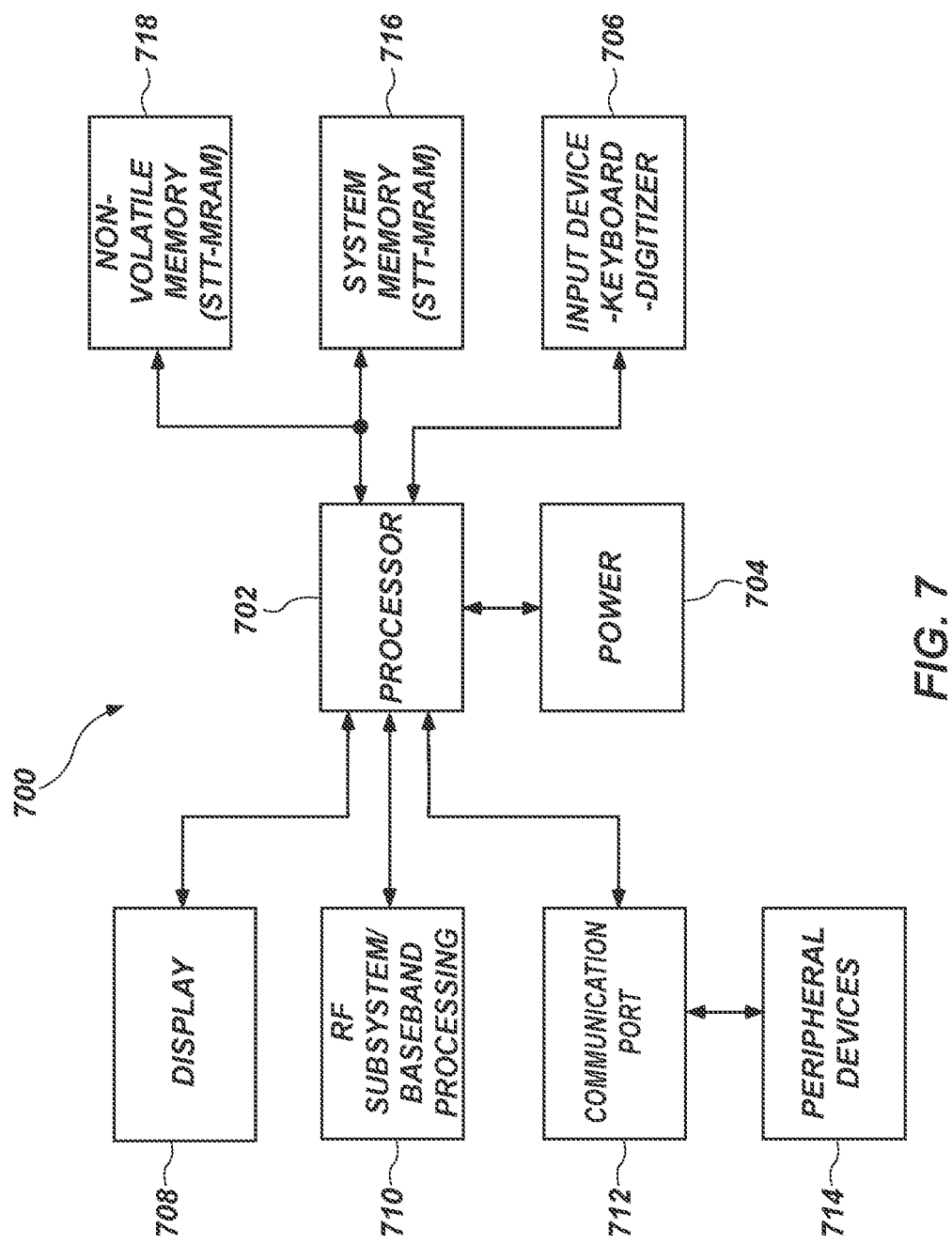
FIG. 7 is a simplified block diagram of a system implemented according to one or more embodiments of the disclosure.

With reference to FIG. 7, depicted is a processor-based system 700. The processor-based system 700 may include various electronic devices manufactured in accordance with embodiments of the present disclosure. The processor-based system 700 may be any of a variety of types such as a computer, pager, cellular phone, personal organizer, control circuit, or other electronic device. The processor-based system 700 may include one or more processors 702, such as a microprocessor, to control the processing of system functions and requests in the processor-based system 700. The processor 702 and other subcomponents of the processor-based system 700 may include memory cells and semiconductor devices manufactured in accordance with embodiments of the present disclosure.

The processor-based system 700 may include a power supply 704 in operable communication with the processor 702. For example, if the processor-based system 700 is a portable system, the power supply 704 may include one or more of a fuel cell, a power scavenging device, permanent batteries, replaceable batteries, and rechargeable batteries. The power supply 704 may also include an AC adapter; therefore, the processor-based system 700 may be plugged into a wall outlet, for example. The power supply 704 may also include a DC adapter such that the processor-based system 700 may be plugged into a vehicle cigarette lighter or a vehicle power port, for example.

Various other devices may be coupled to the processor 702 depending on the functions that the processor-based system 700 performs. For example, a user interface 706 may be coupled to the processor 702. The user interface 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the processor-based system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include one or more of spin torque transfer magnetic random access memory (STT-MRAM), magnetic random access memory (MRAM), dynamic random access memory (DRAM), static random access memory (SRAM), phase-change memory (PRAM), racetrack memory, and other known memory types. The system memory 716 may include volatile memory, non-volatile memory, or a combination thereof. The system memory 716 is typically large so that it can store dynamically loaded applications and data. In some embodiments, the system memory 716 may include semiconductor devices, such as the semiconductor device 600 of FIG. 6, and memory cells such as the memory cell 101 described above with reference to FIG. 1A.

The processor 702 may also be coupled to non-volatile memory 718, which is not to suggest that system memory 716 is necessarily volatile. The non-volatile memory 718 may include one or more of STT-MRAM, MRAM, read-only memory (ROM) such as an EPROM, resistive read-only memory (RROM), and Flash memory to be used in conjunction with the system memory 716. The size of the non-volatile memory 718 is typically selected to be just large enough to store any necessary operating system, application programs, and fixed data. Additionally, the non-volatile memory 718 may include a high capacity memory such as disk drive memory, such as a hybrid-drive including resistive memory or other types of non-volatile solid-state memory, for example. The non-volatile memory 718 may include semiconductor devices, such as the semiconductor device 600 of FIG. 6, and memory cells such as the memory cell 101 described above with reference to FIG. 1A.

Accordingly, in some embodiments, a system comprises a processor, a semiconductor device operably coupled to the processor, the semiconductor device including at least one memory cell, the at least one memory cell comprising a chalcogenide material over a first dielectric material, a second dielectric material over the chalcogenide material, and a liner comprising a dielectric material on substantially all sidewalls of the chalcogenide material. The system further comprises a power supply in operable communication with the processor.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A memory device, comprising:
    a memory material adjacent a first conductive material, wherein sidewalls of the memory material and the first conductive material are substantially coplanar;
    a second conductive material adjacent the memory material and on a side of the memory material opposite the first conductive material; and
    at least one dielectric material substantially surrounding all sides of the memory material.

2. The memory device of claim 1, wherein the memory material comprises a material formulated and configured as a select device.

3. The memory device of claim 1, wherein the at least one dielectric material has a thickness between about 1 nm and about 10 nm.

4. The memory device of claim 1, wherein the at least one dielectric material comprises one or more of aluminum oxide, silicon dioxide, and silicon nitride.

5. The memory device of claim 1, wherein the at least one dielectric material comprises aluminum oxide.

6. The memory device of claim 1, wherein the at least one dielectric material comprises:
    a first dielectric material between the memory material and each of the first conductive material and the second conductive material; and
    a second dielectric material adjacent to the memory material and extending between the first conductive material and the second conductive material.

7. The memory device of claim 6, wherein the first dielectric material has a different material composition than the second dielectric material.

8. The memory device of claim 6, wherein the second dielectric material extends along surfaces of the first conductive material and the second conductive material.

9. The memory device of claim 6, wherein the second dielectric material does not contact the first conductive material or the second conductive material.

10. The memory device of claim 6, further comprising a third dielectric material adjacent to the second dielectric material.

11. The memory device of claim 10, wherein the third dielectric material comprises a different material composition than the second dielectric material.

12. An electronic device, comprising:
a processor operably coupled to a power supply; and
a memory device operably coupled to the processor, the memory device comprising:
a memory material between a first conductive material and a second conductive material;
a dielectric material between the memory material and each of the first conductive material and the second conductive material;
a liner on the memory material, wherein the liner does not contact the dielectric material; and
another liner on the first conductive material and the second conductive material, the another liner having a different material composition than the liner.

13. The electronic device of claim 12, wherein substantially all surfaces of the memory material are in contact with the liner or the dielectric material.

14. The electronic device of claim 12, wherein the liner comprises a dielectric material selected from the group consisting of an oxide material, a nitride material, and an oxynitride material.

15. The electronic device of claim 12, wherein the another liner comprises one or more of aluminum oxide, hafnium oxide, zirconium oxide, silicon dioxide, silicon nitride, silicon carbon nitride, silicon oxynitride, or silicon carboxynitride.

16. A memory device, comprising: a first conductive material; a second conductive material; and a memory material between the first conductive material and the second conductive material, the memory material substantially free of interfaces with any electrically conductive materials, sidewalls of the memory material aligned with sidewalls of the first conductive material.

17. The memory device of claim 16, wherein substantially all surfaces of the memory material are in contact with a dielectric material.

18. The memory device of claim 16, wherein the memory material comprises a chalcogenide material.

* * * * *